(12) United States Patent
Lin et al.

(10) Patent No.: US 6,397,931 B1
(45) Date of Patent: Jun. 4, 2002

(54) FINNED HEAT EXCHANGER

(75) Inventors: Lanchao Lin, Beavercreek; John E. Leland, Kettering; Richard J. Harris, Dayton, all of OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/793,785

(22) Filed: Feb. 27, 2001

(51) Int. Cl.[7] ................................................ H05K 7/20
(52) U.S. Cl. ..................... 165/80.3; 165/80.4; 165/185; 165/81
(58) Field of Search ............................... 165/80.3, 80.4, 165/185, 81; 361/704, 710, 699; 257/719, 722; 174/16.3

(56) References Cited

U.S. PATENT DOCUMENTS

| | | | |
|---|---|---|---|
| 3,180,404 A | * 4/1965 | Nelson et al. | 165/80.3 |
| 4,239,638 A | 12/1980 | Beretta et al. | |
| 4,558,395 A | * 12/1985 | Yamada et al. | 361/385 |
| 4,603,344 A | * 7/1986 | Trommer | 357/76 |
| 4,674,004 A | * 6/1987 | Smith et al. | 361/384 |
| 4,753,290 A | * 6/1988 | Gabuzda | 165/185 |
| 4,884,631 A | * 12/1989 | Rippel | 165/185 |
| 5,706,169 A | * 1/1998 | Yeh | 361/690 |
| 5,823,249 A | 10/1998 | Batchelder | |
| 5,940,288 A | 8/1999 | Kociecki | |
| 6,199,624 B1 | * 3/2001 | Wotring | 165/80.3 |

* cited by examiner

*Primary Examiner*—Allen Flanigan
(74) *Attorney, Agent, or Firm*—Richard A. Lambert; Bobby D. Scearce; Thomas L. Kundert

(57) ABSTRACT

A finned heat exchanger is disclosed. The heat exchanger includes a unitary fin array with a multiplicity of fin banks. Each of the fin banks include a plurality of raised, folded fins for heat transfer. The fin banks extend in a transverse direction and are spaced apart in a longitudinal direction. The fin banks are retained within the fin array by looped expansion turns. The fin array is mounted on a dielectric substrate base. A closed flow channel for directing a flow of coolant is created by adding a cap to the substrate base.

5 Claims, 3 Drawing Sheets

FINNED HEAT EXCHANGER

RIGHTS OF THE GOVERNMENT

The invention described herein may be manufactured and used by or for the Government of the United States for all governmental purposes without the payment of any royalty.

BACKGROUND OF THE INVENTION

The present invention relates generally to heat transfer elements, and more particularly, to a liquid cooled heat exchanger having a plurality of heat transfer fins.

Continued growth in the power density of electronic power devices correspondingly gives rise to increasing heat dissipation requirements as well. Current power electronic devices have heat dissipation requirements much greater than those of just a few years ago. Indeed, the thermal environment of current power electronics is such that overheating has become a major concern.

It is known to use liquid convection heat transfer to cool power electronic devices using synthetic polyalphaolefin (PAO) oil or other mediums as a coolant. The PAO coolant is directed through conduits placed in thermal communication with one side of a dielectric substrate having high thermal conductivity. The electronic components are to the other side of the dielectric substrate and are thus cooled by the heat flux directed through the dielectric substrate and into the PAO coolant.

While this method of heat removal is somewhat effective, a need for improvement exists. More specifically, high thermal stresses can occur from soldering a typically high coefficient of thermal expansion (CTE) heat exchanger to a substrate as well as subsequent device operation which can cause undesirable deformation of the typically low CTE dielectric sheet. And, while conducting the PAO coolant through the conduits provides for some heat removal, as component densities and power output increase, a more efficient and effective cooling mechanism becomes necessary.

It is well known in the cooling art to provide heat transfer fins to enhance the efficiency of heat transfer. The cooling fins found on air-cooled power equipment such as lawn mowers would be a good example of this technique. The cooling fins serve to increase the surface area upon which heat transfer can take place, dramatically improving the overall cooling effectiveness. While simply adding cooling fins to the dielectric sheet would seem to be a convenient solution, in practice, this approach is problematic. Good thermal conductors, (i.e. fin materials such as copper or aluminum) often have high CTEs. Good electronics substrates have much lower CTEs (~⅓ copper or aluminum) so as to match the CTE of the electronics material, silicon. While soldering a fin material to the electronic substrate, can increase heat transfer, it can also introduce a disadvantageous increase of thermal stress within the device due to CTE mismatch caused by initial fabrication and also by subsequent, inefficient heat transfer during operation. These thermal stresses can result in deformation of the dielectric sheet. In a worst case scenario, an excessive deformation could cause the disconnection of some fins from the substrate whereby the heat transfer performance of the device degrades significantly. Micro cracking of the substrate may also occur whereby the dielectric quality degrades and the device is destroyed via an electrical short circuit. While the thermal stress may be reduced by attaching the fin structure by press contact in lieu of soldering, the heat transfer effectiveness would be dramatically reduced by the increased thermal contact resistance.

A need exists therefore for an improved heat transfer device capable of high heat flux operation for cooling high heat flux power electronic devices. Such a heat transfer device would be finned and soldered directly to the substrate for providing highly efficient, reliable high heat flux operation, throughout the range of expected operating conditions yet would not introduce undesirable thermal stresses into the electronic power device during operation.

SUMMARY OF THE INVENTION

Accordingly, it is a primary object of the present invention to provide a finned heat exchanger overcoming the limitations and disadvantages of the prior art.

Another object of the present invention is to provide a finned heat exchanger to provide high heat flux operation.

Yet another object of the present invention is to provide a finned heat exchanger incorporating a unitary fin array that is simple and inexpensive to produce yet can be manufactured from a single sheet of material.

Still another object of the present invention is to provide a finned heat exchanger incorporating a unitary fin array and a closed coolant channel for directing a flow of liquid coolant.

Additional objects, advantages and other novel features of the invention will be set forth, in part, in the description that follows and will, in part, become apparent to those skilled in the art upon examination of the following or may be learned with the practice of the invention. The objects and advantages of the invention may be realized and obtained by means of the instrumentalities and combinations particularly pointed out in the appended claims.

To achieve the foregoing and other objects and in accordance with the purposes of the present invention as described herein, a finned heat exchanger includes a plurality of spaced, adjacent fin banks for providing effective heat transfer.

The preferred embodiment of the finned heat exchanger selected to illustrate the invention includes a unitary fin array. The unitary fin array includes a multiplicity of adjacent fin banks each having a plurality of raised fins for heat transfer. Each of the fin banks are oriented along a transverse direction and are spaced apart from each other in the longitudinal direction.

According to an important aspect of the present invention, the multiplicity of fin banks are each retained within the overall unitary fin array by looped expansion turns at the ends of each of the fin banks. The looped expansion turns provide the dual advantages of retaining the layout and orientation of the fin banks and serving to minimize the buildup of any undesirable thermal stresses within both the fin array and the device that the fin array is attached to. The fin array can be readily manufactured to any size and include any number of fins to accommodate the maximum number of heat transfer applications.

The unitary fin array is attached to a thermally conductive base. The component to be cooled. is attached to the other side of the base. In the preferred embodiment, the base is a dielectric substrate to provide maximum heat transfer while electrically insulating the electrical components from each other. A cap is attached to the base to create a closed coolant flow channel. In the preferred embodiment, the coolant is PAO, a dielectric, synthetic oil coolant ideal for use in electronic devices, however, the finned heat exchanger of the present is not considered limited to any particular coolant.

BRIEF DESCRIPTION OF THE DRAWING

The accompanying drawing incorporated in and forming a part of the specification, illustrates several aspects of the present invention and together with the description serves to explain the principles of the invention. In the drawing.

DETAILED DESCRIPTION OF THE INVENTION

Figure 1:
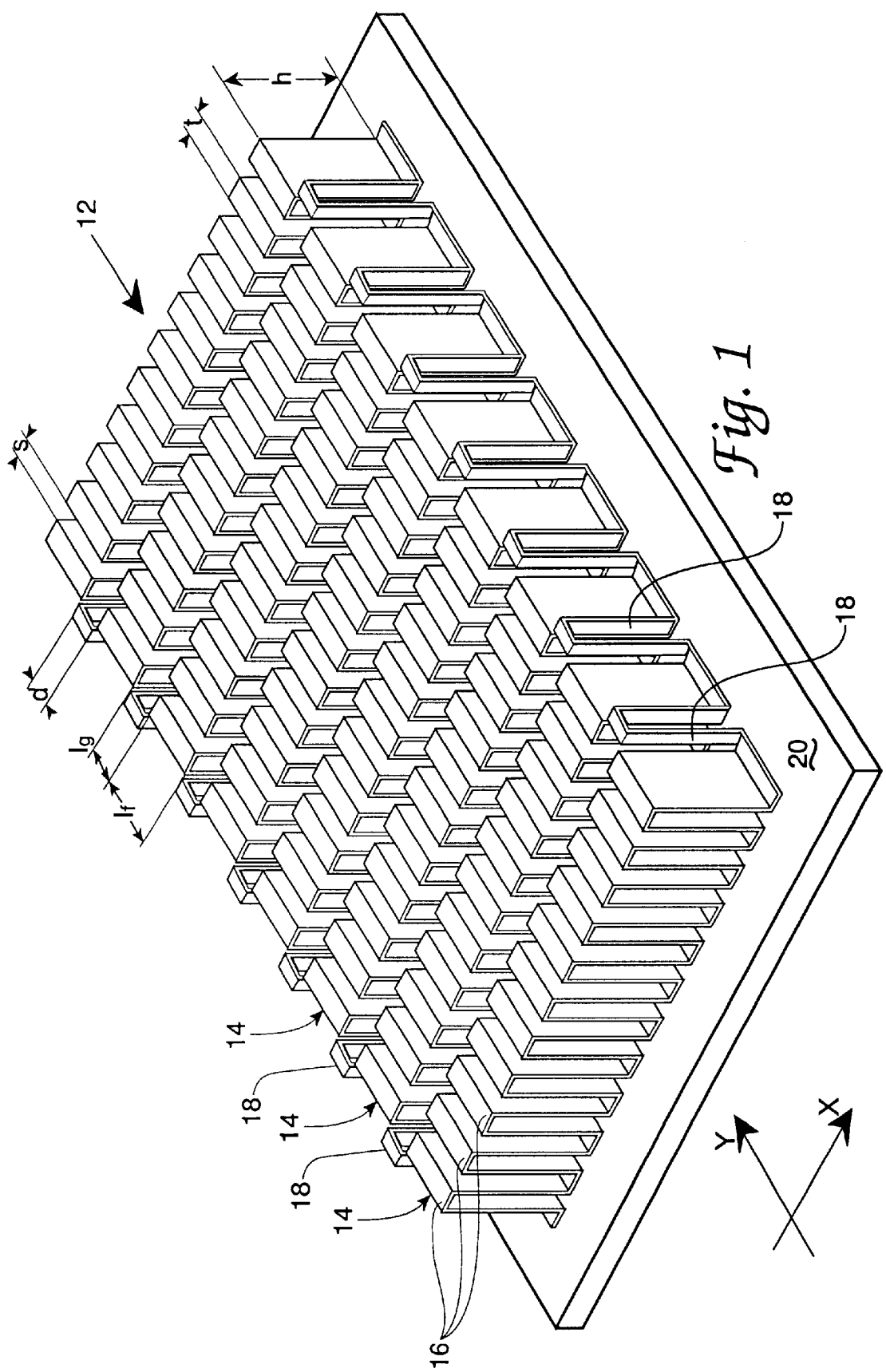
FIG. 1 is a perspective view of the finned heat exchanger of the present invention.
Figure 3:
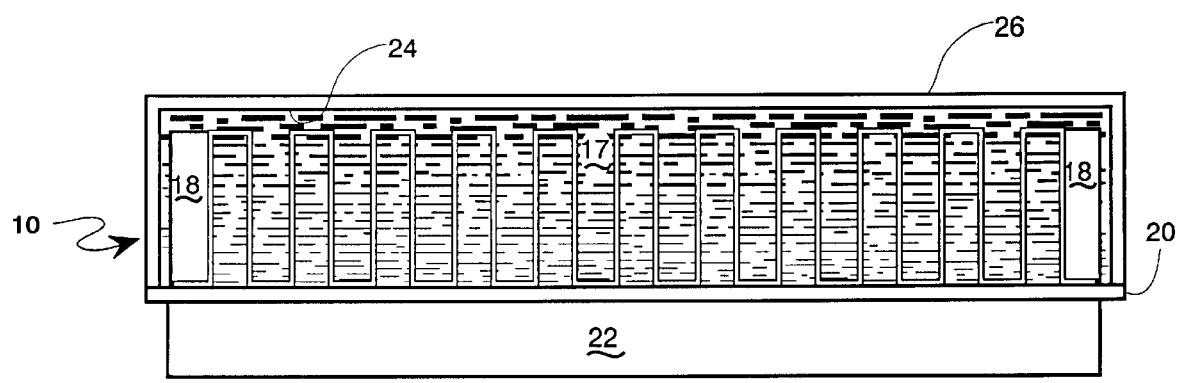

Reference is made to the drawing figures showing the finned heat exchanger of the present invention. As shown in FIG. 1, the finned heat exchanger 10 includes a unitary fin array 12. The fin array 12 includes a multiplicity of fin banks 14, each having a plurality of raised, folded fins 16. Advantageously, and as shown in FIG. 3, the folded fins 16 allow free transference of coolant 17 both through and between the fin spaces, enhancing heat transfer. In the preferred embodiment, the coolant is polyalphaolefin (PAO). PAO is a high dielectric, synthetic hydrocarbon oil having low viscosity and a high flash point, making it ideal for use as a coolant for power electronic devices requiring a high degree of cooling.

As also shown in FIG. 1, each of the fin banks 14 are oriented along a transverse direction, which for the purposes of illustration, is labeled as the X direction. The fin banks 14 are each separated a small distance from the other along a longitudinal direction, labeled Y. The coolant 17 flows in the Y direction.

According to an important aspect of the present invention, a pair of looped expansion turns 18 are located at each end of the fin banks 14. The purpose of the looped expansion turns 18 is twofold, first, they connect the fin banks 14 together to retain them within the overall unitary fin array 12, and second, they allow the unitary fin array 12 freedom to bend and flex, reducing and or eliminating undesirable shear stresses and bending moments within the finned heat exchanger 10.

The fin array 12 is mounted upon one side of a thermally conductive base 20. As will be described in more detail below, the unitary fin array 12 (including the looped expansion turns 18) is fabricated from a single sheet or material. Thus, the unitary fin array 12 is attached to the base by soldering or the like as one piece rather than a collection of many individual pieces. As can be appreciated, this greatly simplifies manufacturing and reduces associated costs. For example, were the fin banks 14 not retained in position by the looped expansion turns 18, each would have to be aligned in position before attachment to the base. This would be a tedious, time consuming and expensive task.

The choice of material for the thermally conductive base 20 varies by application. In the preferred embodiment, the thermally conductive base 20 is a dielectric substrate fabricated from aluminum nitride, providing high thermal conductivity, and a high dielectric strength with a CTE close to that of silicon. As shown in FIG. 3, the power electronic component 22 is mounted upon the other side of the dielectric substrate 20 and, as can be appreciated, the heat flux from the power electronic component 22 travels through the dielectric substrate 20 and into the unitary fin array 12, for transfer into the coolant 17.

A closed flow channel 24 is created by the attachment of a cap 26 as shown in FIG. 3. Inlet and outlet manifolds, not shown, can be placed in fluid communication with the flow channel 24 to direct the flow of the coolant 17 if desired. The flow channel 24 creates a passageway for the coolant 17, directing it through the fin array 12 in the longitudinal, Y direction. As shown, the coolant flows in, around and under the folded fins 16 of the unitary fin array 12, maximizing heat transfer, while minimizing flow resistance. Advantageously, utilization of the folded fins 16, presents a large number of parallel flow passages for the coolant 17 helping to avoid failure of the device should some of the passages become blocked due to foreign debris.

Figure 2:
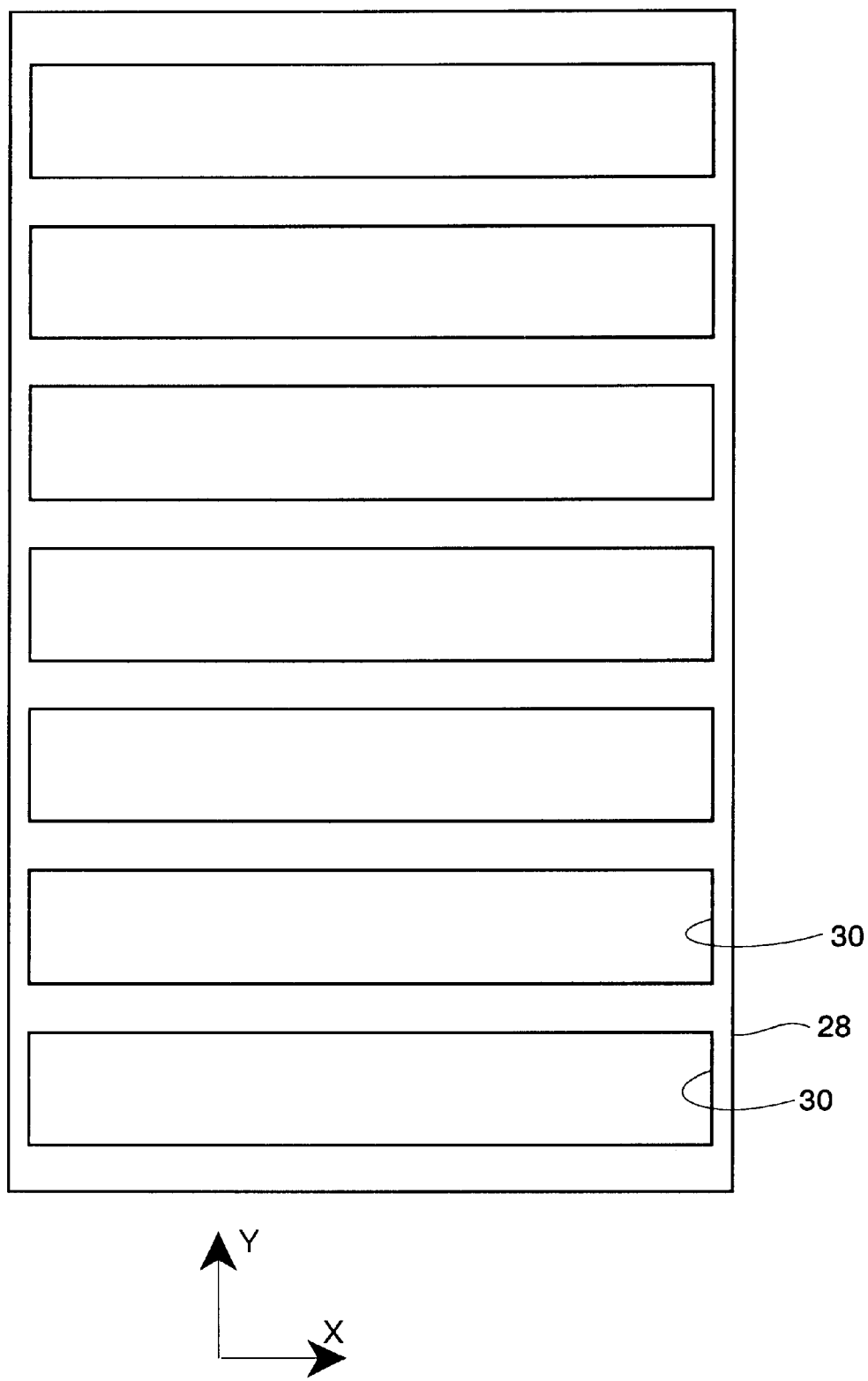
FIG. 2 is an elevational view of a representative sheet of material used as the starting point for the fabrication of the finned heat exchanger of the present invention; and, FIG. 3 is an end view of the finned heat exchanger of the present invention showing the closed flow channel created by the addition of a cap.

According to an important aspect of the present invention, a single sheet of material 28 is utilized to form the unitary fin array 12. As shown in FIG. 2, the sheet 28 includes several holes 30 corresponding to the separation of the fin banks 14. The sheet 28 and holes 30 are dimensioned according to desired number, size and separation distance of the individual fins 16 and the desired separation distance between fin banks 14. The sheet 28 is pressed into a die in order to form the fins 16 in the X direction. After the fins 16 are thus created, the looped expansion turns 18 are created by pressing the sheet of material 28 in a die in the Y direction. The choice of material for the sheet 28 varies by application and material workability considerations. In the preferred embodiment, the material is copper because of its high thermal conductivity and workability. Aluminum is also a good choice because it is less expensive although the thermal conductivity is less than half that of copper. The resulting configuration provides a means for attaching a highly effective heat transfer structure to a typical dielectric substrate without the concomitant increased thermal stress that would be expected by this practice. The geometry of the invention readily allows one skilled in the art to optimize the distribution of point contacts; and fin height thickness and length to minimize thermal stress and maximize heat transfer respectively.

As can be appreciated by one skilled in the art, the dimensions of the components can be varied to suit various applications. In the preferred embodiment, the ratio of the fin thickness, t, to fin height, h, is less than 0.05. The width of the expansion turn d, is approximately equal to the fin bank spacing, $I_g$. Or, with a little modification $I_g$ can be smaller than d. This can be accomplished by slightly undercutting of material 28 in the Y direction on both sides of the holes 30 such that when the sheet 28 is pressed as described above, the undercut portions will be immediately adjacent each of the folded fins 16. Within the unitary fin array 12 thus formed, the height of the expansion turns will still be h, equal to that of the folded fins 16. The difference is that the fin bank spacing $I_g$ would now be less than d. This might be done, for example to create a more compact fin array 12. The flow length of the fins, designated flow length, $I_f$, is determined according to operating conditions but reflects the general principle that decreasing $I_f$ decreases thermal stress. And, lastly, the height and width of the coolant channel 24 exceed that of the fin array 12 by 5% and 2% respectively.

In summary, numerous benefits have been described from utilizing the principles of the present invention. In particular, the finned heat exchanger 10 incorporates a unitary fin array 12 mounted within a closed flow channel 24. The fin array 12 is mounted upon one side of a dielectric substrate, thermally conductive base 20 and a power electronic component 22 is mounted upon the other. A flow of PAO coolant 17 is directed across the unitary fin array 12, thereby cooling the power electronic component 22.

The foregoing description of the preferred embodiment has been presented for purposes of illustration and description. It is not intended to be exhaustive or to limit the invention to the precise form disclosed. Obvious modifications or variations are possible in light of the above teachings. For example, the cap 26 can be omitted, if desired, thereby eliminating the flow channel 24 from the finned heat exchanger 10. This could be done, for example, to enable exposure of the fin array 12 directly to the atmosphere, negating the necessity for a liquid coolant. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

We claim:

1. A finned heat exchanger, comprising:

a unitary fin array having at least two adjacent fin banks, each of said fin banks having a plurality of folded fins disposed in a first, transverse direction, each of said fin banks being spaced apart from an adjacent fin bank in a second, longitudinal direction;

said unitary fin array including a pair of longitudinal strips connecting each of said fin banks, said longitudinal strips being located adjacent the ends of said fin banks and further including looped expansion turns connecting each of said fin banks;

said fin array being mounted upon an unsegmented, thermally conductive base.

2. The finned heat exchanger of claim 1, wherein said fin array is copper.

3. The finned heat exchanger of claim 1, wherein said thermally conductive base is a dielectric substrate.

4. The finned heat exchanger of claim 1 wherein said base is aluminum nitride.

5. The finned heat exchanger of claim 1 further including a coolant flow channel created by affixing a cap upon said base.

* * * * *